United States Patent
Dove et al.

(10) Patent No.: US 6,573,597 B2
(45) Date of Patent: Jun. 3, 2003

(54) CROSS-OVER FOR QUASI-COAXIAL TRANSMISSION LINES FABRICATED ON A SUBSTRATE

(75) Inventors: Lewis R Dove, Monument, CO (US); John F Casey, Colorado Springs, CO (US); Anthony R Blume, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/020,486

(22) Filed: Oct. 29, 2001

(65) Prior Publication Data

US 2003/0080415 A1 May 1, 2003

(51) Int. Cl.[7] .............................................. H01L 23/34
(52) U.S. Cl. ........................ 257/728; 257/662; 257/664
(58) Field of Search ................................ 257/259, 662, 257/664, 728, 758, 776

(56) References Cited

U.S. PATENT DOCUMENTS

| | | | |
|---|---|---|---|
| 5,345,105 A | * 9/1994 | Sun et al. | .................. 257/662 |
| 5,357,138 A | 10/1994 | Kobayashi | |
| 5,510,758 A | * 4/1996 | Fujita et al. | ................. 257/728 |
| 6,373,740 B1 | * 4/2002 | Forbes et al. | ............... 257/664 |
| 6,388,198 B1 | * 5/2002 | Bertin et al. | ................. 257/664 |
| 6,433,408 B1 | * 8/2002 | Anjo et al. | .................. 257/664 |
| 2002/0101723 A1 | * 8/2002 | Bertin et al. | ................. 257/662 |

* cited by examiner

*Primary Examiner*—Steven Loke
*Assistant Examiner*—Quang Vu
(74) *Attorney, Agent, or Firm*—Edward L. Miller

(57) ABSTRACT

Quasi-coaxial transmission lines to be "crossed" (over) are fabricated on a substrate. There are two cases: a true ground plane of metal will cover the substrate, or, each quasi-coaxial transmission line will have its own separate meandering bottom-half ground shield. In either case, when the crossed quasi-coaxial transmission lines are complete they will have top-half ground shields connected to metal against the substrate that is ground. If there is no ground plane the "crossing" quasi-coaxial transmission line that is to cross over must now have its bottom-half ground shield applied. It can overlay any top-half ground shield for any crossed quasi-coaxial transmission line that is in its path. If there is a ground plane, then that step is not necessary. Now a bottom-half layer of KQ dielectric material is applied along the path of the crossing quasi-coaxial transmission line. To this layer of KQ dielectric material is applied a layer of metal that becomes the center conductor. The crossing quasi-coaxial transmission line is finished by printing a top-half layer of KQ dielectric, covered by a layer of metal that is the top-half of ground shield. The edges of this top-half ground shield touch either the ground plane or the outer portion of the bottom-half ground shield.

3 Claims, 4 Drawing Sheets

CROSS-OVER FOR QUASI-COAXIAL TRANSMISSION LINES FABRICATED ON A SUBSTRATE

REFERENCE TO RELATED PATENTS

U.S. Pat. No. 6,255,730 B1 (to Dove, Casey and Blume, issued Jul. 3, 2001) describes various thick film techniques that become possible with the recent advent of certain dielectric materials. These are KQ-120 and KQ-CL907406, which are products of Heraeus Cermalloy, 24 Union Hill Road, West Conshohocken, Pa. Hereinafter, we shall refer to these products as the "KQ dielectric," or as simply "KQ." In particular, that Patent describes the construction of an "encapsulated" microstrip transmission line. This Disclosure concerns further novel and useful thick film techniques pertaining to an encapsulated microstrip transmission line, not heretofore practical, that may be practiced with these KQ dielectric materials. Accordingly, U.S. Pat. No. 6,255,730 B1 is hereby incorporated herein by reference.

BACKGROUND OF THE INVENTION

A "hybrid" circuit consisting of a substrate with various thick film structures thereon that are interconnected with a plurality of ICs continues to be an attractive technique for creating functionally complex high frequency assemblies from "component" ICs. It is often the case that it is necessary or very desirable to use transmission lines to interconnect these ICs, or in connecting them to an external environment. We are particularly interested in the case when the transmission line is of the encapsulated microstrip type described in the incorporated Patent. By the term "encapsulated" that Patent means that the transmission line, which in their example is what would otherwise be called a microstrip, is fully shielded, with a ground completely surrounding the center conductor. It is not exactly what we would ordinarily term a "coaxial" transmission line, since its cross section does not exhibit symmetry about an axis; it has a line and a rectangular trapezoid for a cross section instead of a fat point and surrounding circle. Nevertheless, we shall find it appropriate and convenient to call it (the 'encapsulated' transmission line of the '730 B1 Patent) a 'quasi-coaxial' transmission line, which, it should be noted, is pretty small (perhaps 0.050" wide by 0.010" or 0.015" high).

It will be convenient for the description that follows to introduce a useful terminology to describe the parts of a quasi-coaxial transmission line. We shall say that it has a bottom-half ground shield (which may be that portion of an entire ground plane that is covered by the quasi-coaxial transmission line, or be a meandering ribbon of metal along the path the quasi-coaxial transmission line is to take). Above that is a bottom-half portion or layer of KQ dielectric material, on top of which is a (narrower) metal layer serving as center conductor, followed above by a top-half layer of KQ dielectric material (preferably not quite as wide as the bottom-half layer of KQ material, but in any event, wider than the center conductor), and all of which is enclosed by a top-half ground shield whose edges contact the bottom-half ground shield. This terminology is not found in the incorporated '730 B1 Patent, and it omits the optional loading resistances (210), but will otherwise be found to be in perfect agreement with FIG. 2 of that Patent, and with its description therein.

So now we have hybrids with quasi-coaxial transmission lines to interconnect things. We also have an old problem familiar to those who have laid out printed circuit boards: two traces need to cross each other, and no amount of laying things out another way will avoid it. The same situation can arise with our quasi-coaxial transmission lines on a substrate: we feel the need for one of them to cross over of a substrate to the other, allowing the cross-over to occur by virtue of the two paths being now on opposite sides. This is an expensive solution for many reasons (holes in ceramic are a last resort, and it may be very desirable for mounting and heat removal purposes to not have anything on one side of the substrate, etc.), not to mention that the effect on the transmission line itself would likely be extreme. The transition from one side of the substrate to the other would, in all probability, introduce a severe discontinuity. Other solutions that involve bridging with a short length of conductor, say, tiny coax, to jump one transmission line over the other, have their own significant drawbacks. What to do?

SUMMARY OF THE INVENTION

A solution to the problem of crossing quasi-coaxial transmission lines fabricated on a substrate is to first fabricate all the quasi-coaxial transmission lines that are to remain at substrate level and be "crossed." There are two cases: a true ground plane of metal will cover the substrate, or, each quasi-coaxial transmission line will have its own separate meandering bottom-half ground shield. In either case, when the crossed quasi-coaxial transmission lines are complete they will have top-half ground shields connected to metal against the substrate that is ground. In the case of a true ground plane, it is now looks as if it has an infestation of worms. If there is no ground plane the "crossing" quasi-coaxial transmission line that is to cross over must now have its bottom-half ground shield applied. It can overlay any top-half ground shield for any crossed quasi-coaxial transmission line that is in its path. If there is a ground plane, then that step is not necessary, since ground is everywhere, already. Now a bottom-half layer of KQ dielectric material is applied along the path of the crossing quasi-coaxial transmission line, including right over the top of any crossed quasi-coaxial transmission line. To this bottom-half layer of KQ dielectric material is applied a layer of metal that becomes the center conductor of the crossing quasi-coaxial transmission line. Subsequently, the crossing quasi-coaxial transmission line is finished by printing a top-half layer of KQ dielectric, covered by a layer of metal that is the top-half of ground shield. The edges of this top-half ground shield touch either the ground plane or the outer portion of the bottom-half ground shield, which was made wide enough for that purpose.

DESCRIPTION OF A PREFERRED EMBODIMENT

Figure 1:
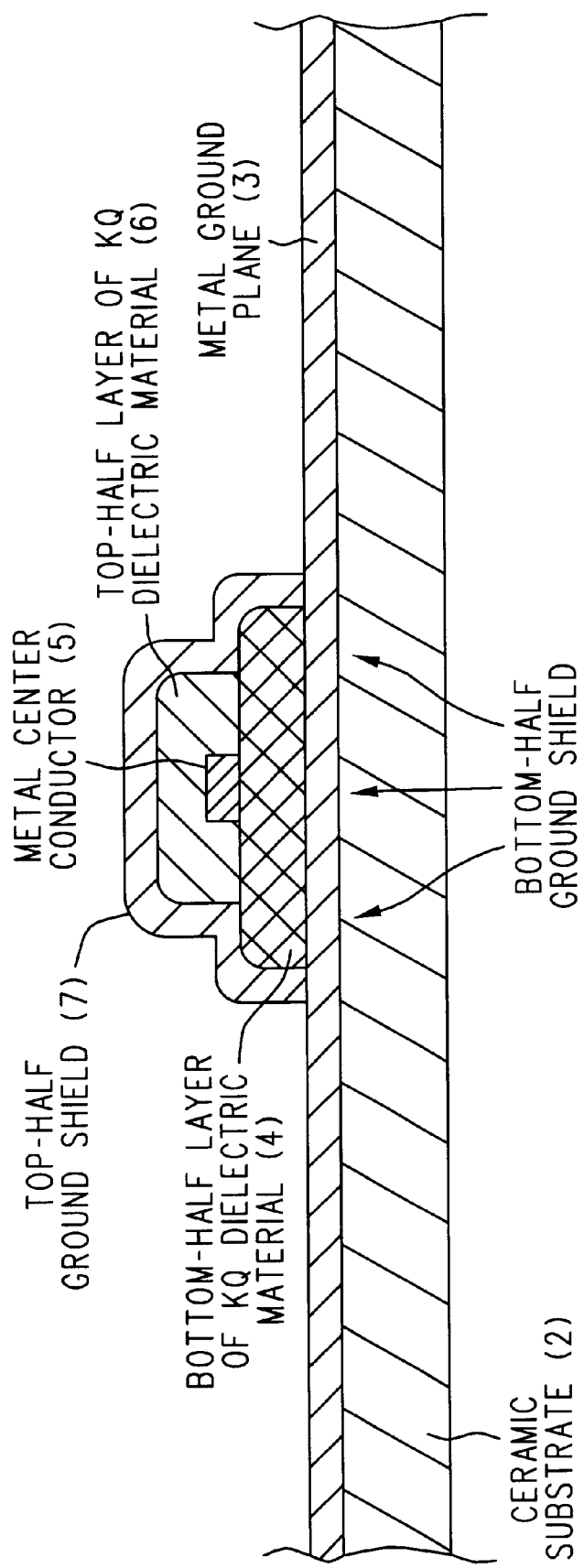
FIG. 1 is an idealized sectional view of a prior art quasi-coaxial transmission line deposited on a substrate.

Refer now to FIG. 1, wherein is shown a simplified representation 1 of a prior art quasi-coaxial transmission line fabricated upon a substrate 2, which could, for example be 96% alumina 0.040" thick. The quasi-coaxial transmission line is generally fabricated according to the thick film techniques taught in the incorporated '730 B1 Patent. In particular, note the ground plane 3, deposited on the "top" of the substrate 2 (i.e., on the same side as the quasi-coaxial transmission line), and which, as ground planes do, may extend liberally in all directions as needed. The ground plane may be of metal, preferably gold, and if patterns therein are needed, an etchable thick film Au process, such as the Heraeus KQ-500 may be used. The quasi-coaxial transmission line itself includes a bottom-half layer or strip 4 of KQ dielectric material, that meanders as needed for the desired path of the transmission line. (By "meanders" we do not necessarily mean that a serpentine path is taken—only that it goes where it needs to.) Once that bottom-half layer 4 is in place, a suitable layer or strip of metal 5 (which is preferably Au) is deposited on the top surface of the bottom-half layer 4. This strip of metal 5 is the center conductor of the quasi-coaxial transmission line. Subsequently, a top-half layer or covering strip 6 of KQ dielectric is deposited on top of the bottom-half layer 4, enclosing the center conductor 5. Finally, an enclosing top-half ground shield 7 of metal (preferably Au) is deposited over the combined KQ layers 4 and 5, with the result that the center conductor 5 is completely surrounded by ground, and thus becomes a quasi-coaxial transmission line. The characteristic impedance of that quasi-coaxial transmission line is determined in a known manner by the dielectric constant of the KQ material and the dimensions of the KQ layers 4 and 5. Thus, the quasi-coaxial transmission line 9 may be fabricated to have a particular characteristic impedance, such as 50Ω, or perhaps 75Ω, as desired. On the other hand, however, it may be the case that no particular or constant value of characteristic impedance is required or desired, and the what is being fabricated is simply shielded conductors for conveyance of power supply, bias or control voltages.

Before proceeding, however, a brief note is in order concerning the ground plane 3. As a true ground plane it will perform best if it is indeed a broad sheet of metal, and that is what the figure shows. On the other hand, the portions of such a ground plane not beneath the quasi-coaxial transmission line do not afford any particular benefit to the transmission line, insofar as it is a transmission line considered in isolation. The situation may become more complex if there are other circuits located to one side of the transmission line that require strong RF currents to be carried in a ground plane; good practice would be to keep such currents out of the shield for the transmission line.

There are even mysterious circumstances where, despite best efforts, the shields of two different transmission lines depart from ground (and from each other), and a pernicious RF current circulates through their shields if they are allowed to touch at both ends. In any event, it may be desirable to not have an entire plane of metal serving as ground for all the quasi-coaxial transmission lines on the substrate. In an extreme such case only the path of the transmission line needs to have a sufficiently wide ground (bottom-half ground shield) put down before the quasi-coaxial transmission line is fabricated on top thereof. It would need to be wide enough to allow good registration and subsequent electrical contact with the top-half ground shield. And it might well be desirable that when that quasi-coaxial transmission line crossed another their shields do not experience electrical contact.

It will thus be appreciated that either the portion of an entire ground plane that is directly beneath the quasi-coaxial transmission line, or a sufficiently wide meandering ribbon of ground metal, forms what we have called the bottom-half ground shield. Compare the legend in FIG. 1 with element 14 in FIGS. 3 and 4.

Figure 2:
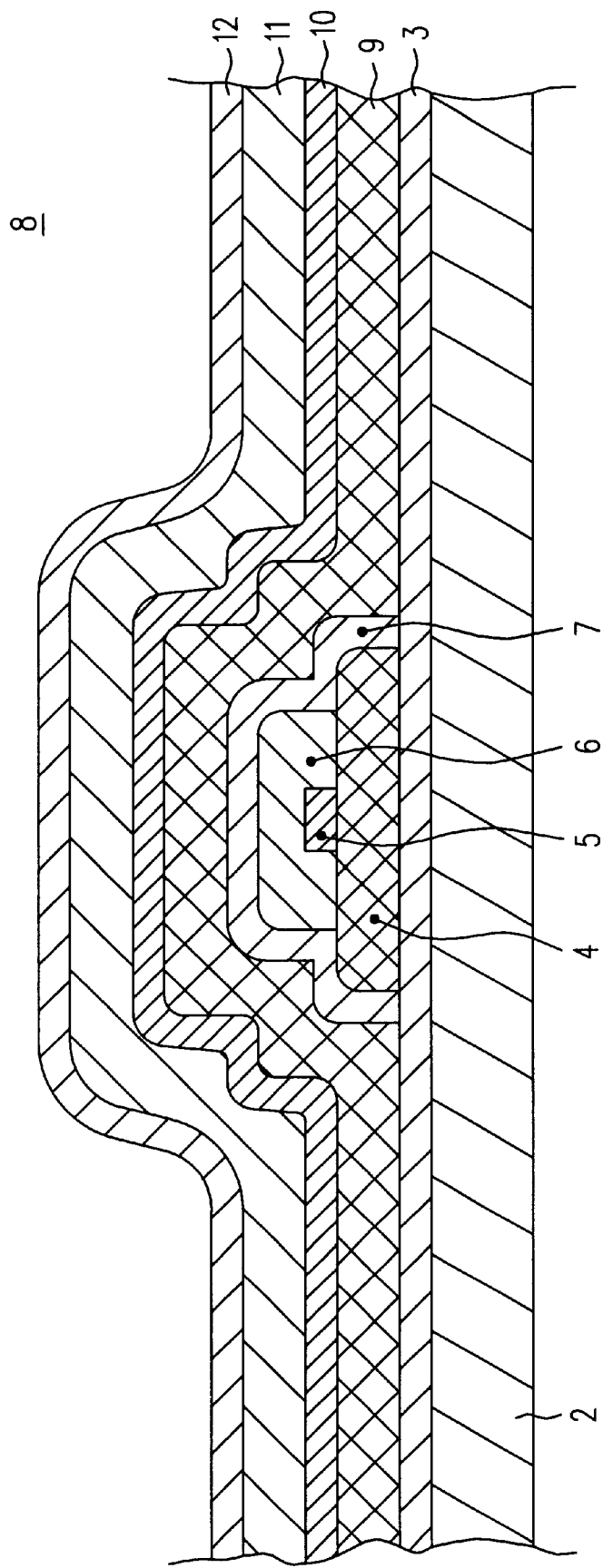
FIG. 2 is an idealized sectional view of two quasi-coaxial transmission lines crossing each other on a substrate in accordance with one aspect of the invention.

Before proceeding to FIG. 2, a brief word is in order concerning FIG. 1. It is principally a reworking of FIG. 2 of the incorporated '730 B1 Patent. However, a comparison would reveal the absence of the optional loading resistances 210. This is merely a simplification on our part, for clarity and ease of appreciation in the drawing. We do not mean to imply, and no one should infer, that these resistances are to be absent of necessity in any of the embodiments described herein. To the contrary, in this description we take the position that it is up to the designer to decide if they should be present or not, depending on the circumstances.

Refer now to FIG. 2, which is a cross sectional view 8 of a "crossed" quasi-coaxial transmission line (3, 4, 5, 6, 7) extending in a direction normal to the page and being crossed over by a "crossing" quasi-coaxial transmission line (3, 9, 10, 11, 12) along a direction parallel to the page. The view is located to contain a mid-point of their intersection, so that both quasi-coaxial transmission lines are shown in cross section. Element 9 is a bottom-half layer of KQ dielectric material, element 10 is a metallic center conductor, element 11 is a top-half layer of KQ dielectric material, and element 12 is a top-half ground shield. It will be noted that the substrate 2 is covered by an extensive ground plane 3 that thus serves as the bottom-half ground shield for both of the "crossed" and the "crossing" quasi-coaxial transmission lines.

Figure 3:
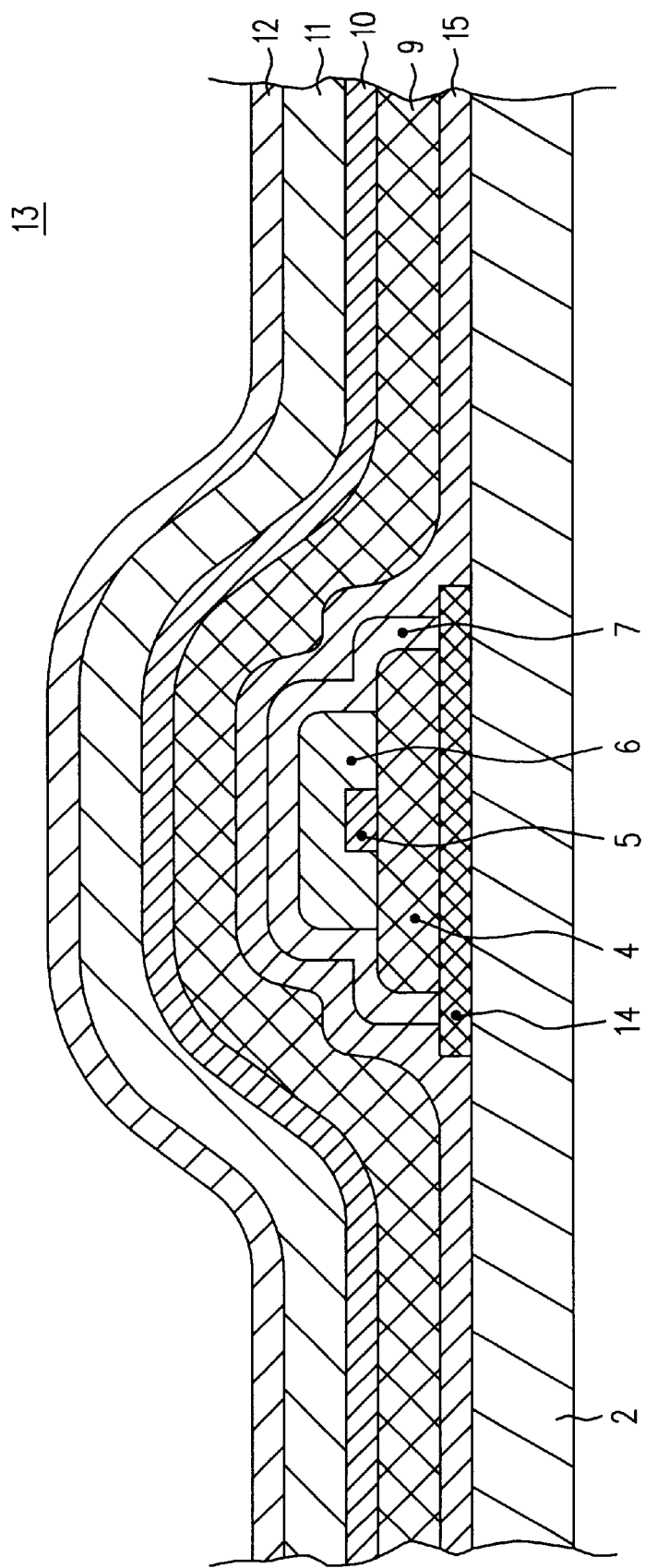
FIG. 3 is an idealized sectional view of two quasi-coaxial transmission lines crossing each other on a substrate in accordance with another aspect of the invention.

Refer now to FIG. 3, where a somewhat different circumstance 13 is depicted than in FIG. 2, but where like elements retain the same reference number. The different circumstance is that the crossed quasi-coaxial transmission line (14, 4, 5, 6, 7) and the crossing quasi-coaxial transmission line (15, 9, 10, 11, 12) do not share the ground plane as their respective bottom-half ground shields. In this case those bottom-half ground shields (14, 15) are independent, although they are allowed to come into electrical contact at the location of the crossing. That is, the underside of bottom-half ground shield 15 of the crossing quasi-coaxial transmission line electrically contacts (indeed, is deposited upon) the top surface of the top-half ground shield 7 for the crossed quasi-coaxial transmission line. Element 15 also touches element 14 at the edges of element 14.

One might note that FIG. 3 is consistent with element 15 being a ground plane viewed on edge. This is possible, but seems unlikely. A more likely situation for FIG. 3 is where that region of the substrate 2 does not need, or perhaps should not have, a true extensive ground plane, or perhaps that the situation does not involve quasi-coaxial transmission lines at all, but merely shielded conductors for non-RF voltages. In any event, note that element 14 is a ribbon-like bottom-half ground shield, regardless of whether bottom-half ground shield 15 is also ribbon-like, or is a true ground plane (ala 3).

Figure 4:
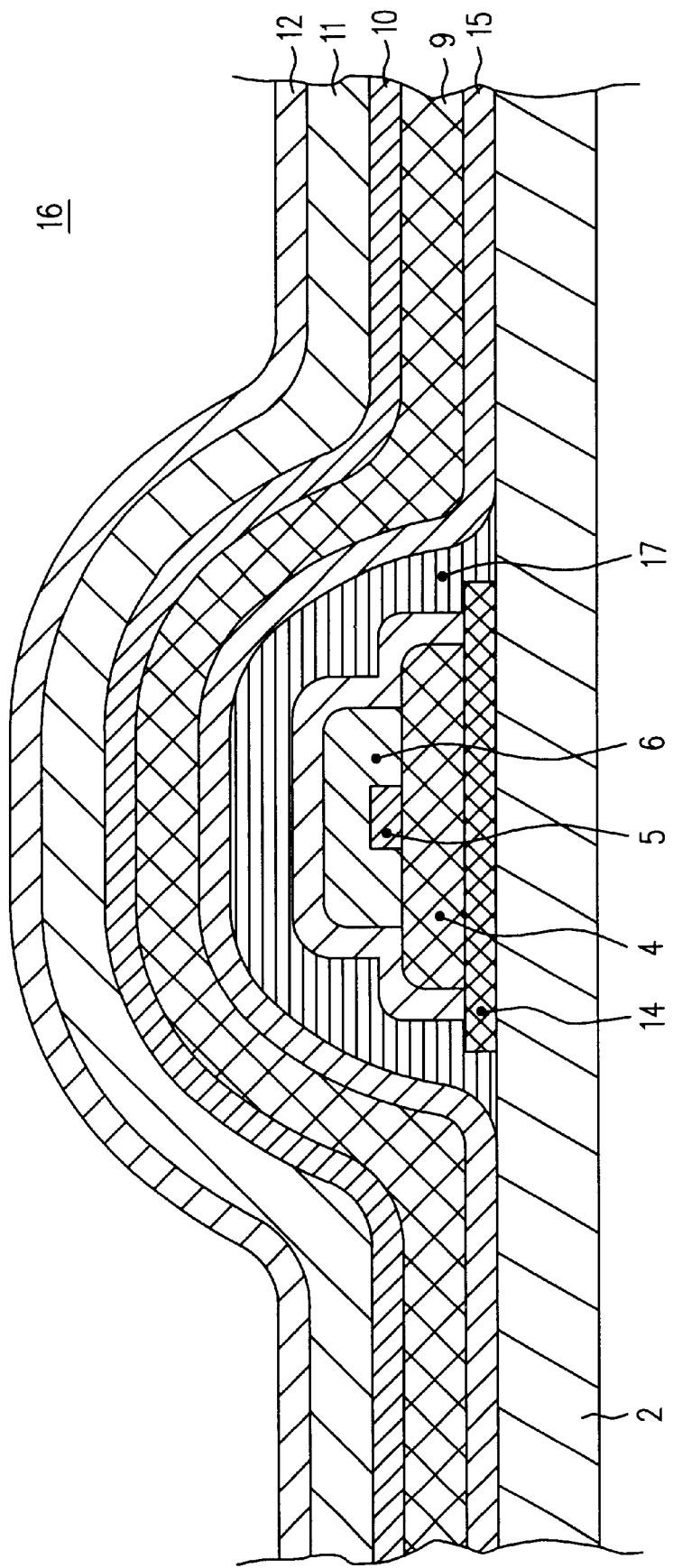
FIG. 4 is an idealized sectional view of two isolated quasi-coaxial transmission lines crossing each other on a substrate in accordance with still another aspect of the invention.

Refer now to FIG. 4, wherein is depicted yet another arrangement 16 of crossing quasi-coaxial transmission lines (14, 4, 5, 6, 7 and 15, 9, 10, 11, 12). The situation is different in that, for whatever reason, the ground shields for these quasi-coaxial transmission lines are to be kept from experiencing electrical contact at the location of their crossing. To this end, note that a suitable amount of non-conductive material 17 (which may be KQ dielectric material, or some other suitable insulator) has been applied over the crossed quasi-coaxial transmission line (14, 4, 5, 6, 7) at the location where it is crossed over by crossing quasi-coaxial transmission line (15, 9, 10, 11, 12). And if desired, the shape of the deposition for material 17 could be changed by lengthening it (an perhaps also tapering it) in the left and right horizontal directions (as viewed in the figure) to provide a more gentle ramp and a less abrupt transition that may have a more constant characteristic impedance for the crossing quasi-coaxial transmission line (15, 9, 10, 11, 12)

In conclusion, it will be appreciated that, although we have not separately mentioned every step of cleaning, deposition, printing, masking, etching, trimming, etc., that arises to create the structures shown in the Figures and described herein, it will nevertheless be clear to one skilled in the thick film arts how to proceed, given the teaching of the incorporated '730 B1 Patent and the conventional practices of the thick film arts. It will also be appreciated that the techniques disclosed herein may be used to fabricate crossovers involving more than just two quasi-coaxial transmission lines. The topology of which one crosses and which one is crossed, in what order, and if that occurs singly or whether several are grouped close together and crossed as a unit, are all items of choice within the purview of the invention. In this connection, we note that one might fill 'valleys' between adjacent quasi-coaxial transmission lines with a filler of KQ dielectric material to provide a flatter surface for a crossing quasi-coaxial transmission line to be fabricated upon. It will readily be appreciated that these and other variations fall squarely within the spirit and scope of the present invention.

We claim:

1. Apparatus comprising:

a substrate having a flat surface that is substantially planar and free of trenches;

a first quasi-coaxial transmission line fabricated upon the substrate;

a second quasi-coaxial transmission line fabricated on the same side of the substrate as the first quasi-coaxial transmission line and crossing over the first quasi-coaxial transmission line; and wherein each quasi-coaxial transmission line is fully shielded and each comprises a respective lower ground shield deposited on the flat surface of the substrate, a bottom ribbon of dielectric material deposited on the lower ground shield, a center conductor deposited on the bottom ribbon of dielectric material, a top ribbon of dielectric deposited over the center conductor and the bottom ribbon of dielectric material, and a unitary upper ground shield deposited as a single unit over the combined top and bottom ribbons of dielectric material, the unitary upper ground shield being, at locations along the first quasi-coaxial transmission line and at locations along the second quasi-coaxial transmission line different from where it crosses over the first quasi-coaxial transmission line, in continuous physical contact with opposing locations of the lower ground shield on each side of the bottom ribbon of dielectric material; and further wherein at the location where the second quasi-coaxial transmission line crosses over the first quasi-coaxial transmission line: (a) the bottom ribbon of dielectric material of the second quasi-coaxial transmission line, the center conductor of the second quasi-coaxial transmission line, the top ribbon of dielectric material of the second quasi-coaxial transmission line and the unitary upper ground shield of the second quasi-coaxial transmission line, extend over the first quasi-coaxial transmission line; (b) the unitary upper ground shield of the first quasi-coaxial transmission line serves as a portion of the lower ground shield of the second quasi-coaxial transmission line; and (c) an extended portion of unitary upper ground shield for the second quasi-coaxial transmission line that crosses over the first quasi-coaxial transmission line is in continuous physical contact on opposing its sides with a crossed-over portion of the unitary upper ground shield of the first quasi-coaxial transmission line.

2. Apparatus as in claim 1 further comprising a ground plane deposited upon the flat surface of the substrate and wherein the lower ground shields of the first and second quasi-coaxial transmission lines are each a part of the ground plane.

3. Apparatus comprising:

a substrate having a flat surface that is substantially planar and free of trenches;

a first quasi-coaxial transmission line fabricated upon the substrate;

a second quasi-coaxial transmission line fabricated on the same side of the substrate as the first quasi-coaxial transmission line and crossing over the first quasi-coaxial transmission line;

an insulating layer covering the first quasi-coaxial transmission line at the location thereof where it is crossed by the second quasi-coaxial transmission line; and wherein each quasi-coaxial transmission line is fully shielded and each comprises a respective lower ground shield deposited on the flat surface of the substrate, a bottom ribbon of dielectric material deposited on the lower ground shield, a center conductor deposited on the bottom ribbon of dielectric material, a top ribbon of dielectric deposited over the center conductor and the bottom ribbon of dielectric material, and a unitary upper ground shield deposited as a single unit over the combined top and bottom ribbons of dielectric material, the unitary upper ground shield being, at locations along the first quasi-coaxial transmission line and at locations along the second quasi-coaxial transmission line different from where it crosses over the first quasi-coaxial transmission line, in continuous physical contact with opposing locations of the lower ground shield on each side of the bottom ribbon of dielectric material; and further wherein at the location where the second quasi-coaxial transmission line crosses over the first quasi-coaxial transmission line: (a) the lower ground shield of the second quasi-coaxial transmission line, the bottom ribbon of dielectric material of the second quasi-coaxial transmission line, the center conductor of the second quasi-coaxial transmission line, the top ribbon of dielectric material of the second quasi-coaxial transmission line and the unitary upper ground shield of the second quasi-coaxial transmission line, extend over the first quasi-coaxial transmission line; and (b) an extended portion of unitary upper ground shield for the second quasi-coaxial transmission line that crosses over the first quasi-coaxial transmission line is in continuous physical contact with opposing locations of an extended portion of the lower ground shield of the second quasi-coaxial transmission line on each side of the extended bottom ribbon of dielectric material of the second quasi-coaxial transmission line.

\* \* \* \* \*